United States Patent
Saitoh et al.

(10) Patent No.: US 6,703,254 B2
(45) Date of Patent: Mar. 9, 2004

(54) METHOD FOR MANUFACTURING SEMICONDUCTOR LASER DEVICE

(75) Inventors: Kimihiko Saitoh, Sodegaura (JP); Akira Izumi, Nomi-gun (JP); Hideki Matsumura, Kanazawa (JP)

(73) Assignee: Mitsui Chemicals, Inc., Tokyo (JP)

( * ) Notice: Subject to any disclaimer, the term of this patent is extended or adjusted under 35 U.S.C. 154(b) by 23 days.

(21) Appl. No.: 10/111,280

(22) PCT Filed: Aug. 22, 2001

(86) PCT No.: PCT/JP01/07174

§ 371 (c)(1),
(2), (4) Date: Apr. 22, 2002

(87) PCT Pub. No.: WO02/17450

PCT Pub. Date: Feb. 28, 2002

(65) Prior Publication Data

US 2002/0155631 A1 Oct. 24, 2002

(30) Foreign Application Priority Data

Aug. 22, 2000 (JP) ........................ 2000-251684

(51) Int. Cl.⁷ .................. H01L 21/00; H01L 21/46; H01S 5/00
(52) U.S. Cl. .................. 438/29; 438/29; 438/31; 438/458; 372/45; 372/48
(58) Field of Search .................. 372/45, 48; 438/31, 438/458, 29

(56) References Cited

U.S. PATENT DOCUMENTS

| | | | | |
|---|---|---|---|---|
| 4,331,737 A | * | 5/1982 | Nishizawa et al. | 428/457 |
| 5,144,634 A | * | 9/1992 | Gasser et al. | 372/49 |
| 5,668,049 A | * | 9/1997 | Chakrabarti et al. | 438/33 |
| 5,764,668 A | | 6/1998 | Ishizaka et al. | |
| 5,780,120 A | * | 7/1998 | Belouet et al. | 427/554 |
| 5,834,379 A | * | 11/1998 | Shealy et al. | 438/767 |
| 5,851,849 A | * | 12/1998 | Comizzoli et al. | 438/38 |
| 2003/0047739 A1 | * | 3/2003 | Lindstrom et al. | 257/79 |

FOREIGN PATENT DOCUMENTS

| | | |
|---|---|---|
| JP | 49-31270 | 3/1974 |
| JP | 56-162841 | 12/1981 |
| JP | 58-125832 | 7/1983 |
| JP | 3-89585 | 4/1991 |
| JP | 9-64453 | 3/1997 |
| JP | 10-209562 | 8/1998 |

OTHER PUBLICATIONS

Hideki Matsumura, "Formation of Silicon–Based Thin Films Prepared by Catalytic Chemical Vapor Deposition (Cat–CVD) Method", Japanese Journal of Applied Physics, vol. 37, Part 1, No. 6A, Jun. 1998, pp. 3175–3187.

A. Izumi et al., "Surface cleaning and nitridation of compound semiconductors using gas–decomposition reaction in Cat–CVD method", Thin Solid Films, vols. 343–344, Elsevier Science, Apr. 1999, pp. 528–531.

Akiyoshi Kudo et al., "Study on improvement on uniformity of Cat–CVD SiNx thin films", IEICE Technical Report, vol. 99, No. 21, Apr. 1999, Japan, pp. 59–66.

* cited by examiner

*Primary Examiner*—Matthew Smith
*Assistant Examiner*—Chuong A Luu
(74) *Attorney, Agent, or Firm*—Burns, Doane, Swecker & Mathis, LLP

(57) ABSTRACT

A semiconductor thin film including a well layer is laminated on a semiconductor substrate, the semiconductor substrate and the semiconductor thin film is cleaved, and a cleavage plane of the semiconductor substrate and the semiconductor thin film, which is obtained by the cleaving, is exposed to an atmosphere produced by decomposition of a gas containing N-atoms under the presence of a heated catalytic substance, thereby a surface layer of the cleavage plane is removed and a nitride layer is formed on the surface. Subsequently, a dielectric film is formed on the cleavage plane. According to the above technique, a natural oxide film formed on the cleavage plane can be removed and also a protective film can be formed by using a catalytic CVD apparatus.

4 Claims, 8 Drawing Sheets

METHOD FOR MANUFACTURING SEMICONDUCTOR LASER DEVICE

TECHNICAL FIELD

The present invention relates to a method of manufacturing a high-power semiconductor laser device with long-term reliability.

BACKGROUND ART

A semiconductor laser has been used for apparatuses in various fields such as information communications, printings, processing, medical applications, or the like. It is necessary to improve power and reliability of the semiconductor laser as a light source, so as to improve the performance of these apparatuses.

In general, the semiconductor laser has a structure in which an active layer is sandwiched between a p-type cladding layer and an n-type cladding layer. Then, a substrate having the layers laminated thereon is cleaved and laser light is generated by applying a current to the active layer using the cleavage plane as a resonator plane. Then, one of two cleavage planes serving as resonator planes, becomes a light outputting part. Further, the two cleavage planes are coated with a dielectric film for controlling the reflectance or suppressing deterioration with time caused by chemical reaction on a cleavage surface.

When cleaving is carried out in general air atmosphere, a natural oxide film is formed on the cleavage surface. Taking GaAs compound as an example, high-density surface levels, which is mainly caused by oxygen binding of Ga and As, are present in the natural oxide film on the cleavage plane. Then, emitted light is absorbed by the natural oxide film as a non-radiative recombination center. Due to the light absorption, heat is generated in the vicinity of the cleavage plane, and a forbidden bandwidth of the active region is decreased, resulting in further increasing light absorption. Consequently, the cleavage plane is melted away, causing deterioration of the laser output considerably. Therefore, to achieve a high-power semiconductor laser with high reliability, it is necessary to preclude the formation of a natural oxide film formed on the cleavage plane, particularly.

Conventionally, to prevent the natural oxide film from being formed, the following processes are accomplished. That is, after cleaving is carried out in high vacuum, a protection layer is formed without exposing the cleavage plane to the air before forming a natural oxide film is formed, or after cleaving is carried out in an atmospheric air, the natural oxide film formed on the cleavage plane is removed by an electron beam heating, a laser irradiation, or plasma exposure using an inert gas so as to form a protection film. In addition, another method is also accomplished. That is, after placing the cleavage plane into a vacuum apparatus, the cleavage plane is exposed to a halogen gas at 400° C. or higher. Then, an oxide layer is removed by thermochemical reaction, and a compound semiconductor layer and the like is formed thereon.

However, the above mentioned cleavage operation in high vacuum is required for extremely high vacuum level depending on the process time, resulting in requiring high cost or strict control of apparatuses.

Further, according to the method of forming a protection film by removing a natural oxide film by means of an electron beam heating, a laser irradiation, or plasma exposure using an inert gas, the natural oxide film or surface contaminants is removed by a physical method, mainly. Therefore, there is a concern that defects are introduced in a surface layer in addition to the removal of these. Using the above methods, in particular, oxygen binding of Ga and As can be removed, however, the introduced defects function as a recombination center. Consequently, it is necessary to perform precise control of processing conditions or the like for an improvement of these methods.

Further, according to the method of thermochemical reaction with a halogen gas, since it is necessary to heat the halogen gas to 400° C. or higher, an electrode cannot be formed before the cleavage operation. Instead, an electrode is formed after forming a protection film for the resonator plane which is formed by cleaving. Consequently, there exists a problem in that processes become inconvenient and complicated.

DISCLOSURE OF INVENTION

The invention is proposed to solve the above problems. According to the invention, a natural oxide film formed on a cleavage plane is removed and also a protection film is formed by using a catalytic Chemical Vapor Deposition (CVD) apparatus.

Namely, the invention provides a method of manufacturing a semiconductor laser comprising the steps of:

laminating a semiconductor thin film comprising a well layer on a semiconductor substrate;

cleaving the semiconductor substrate and the semiconductor thin film;

exposing a cleavage plane of the semiconductor substrate and semiconductor thin film obtained by cleaving to an atmosphere produced by decomposition of a gas containing N atoms, under the presence of heated catalytic substances, thereby removing the surface layer of the cleavage plane and forming a nitride layer on the surface; and subsequently forming a dielectric film on the cleavage plane.

According to the invention, even if the resonator plane of the semiconductor laser is formed by cleaving in the air, a surface layer made of a natural oxide film formed on the cleavage plane is exposed in a vacuum apparatus to a gas containing N-atoms, which are changed into radical in the catalytic CVD apparatus. By doing this, etching removal can be carried out at a low substrate temperature with extremely low level of damage of the semiconductor thin film, and at the same time a nitride layer, which has excellent chemical stability, can be formed. As the gas containing N-atoms, ammonia ($NH_3$), hydrazine ($NH_2NH_2$), or the like can be used. Since the nitride layer has a wide band gap and terminates and decreases defects, it is very preferable material in view of junction between a semiconductor and a dielectric film. In general, when GaAs is used in III–V group semiconductor laser, however, a GaN layer is formed therein.

Subsequently, by forming a dielectric film on the cleavage plane, the dielectric film is formed on the face from which the natural oxide film is removed. Because of this, it is possible to prevent temperature from increasing due to light absorption and to prevent the cleavage plane from melting when emitting laser light. Then, since the nitride layer formed on the cleavage plane, from which the natural oxide film is removed, has excellent chemical stability, reoxidation will not occur even if the cleavage plane is exposed to the air. Therefore, between the step of exposing the cleavage plane to the atmosphere produced by decomposition of a gas containing N-atoms using the catalytic CVD apparatus and the step of forming the dielectric film, it is allowed to expose the semiconductor substrate to the air.

Further, in comparison with the case where plasma process such as sputtering is used for forming the dielectric film, the method in which after eliminating the natural oxide film and forming the nitride film by the catalytic CVD apparatus then forming the silicon nitride film by means of the catalytic CVD apparatus is preferable because plasma damage caused by ion impacts on the cleavage plane can be eliminated. That is, after removing the natural oxide film and forming the nitride film by means of the catalytic CVD apparatus, the silicon nitride film is subsequently formed by using the same catalytic CVD apparatus. The silicon nitride film is formed by exposing the cleavage plane to an atmosphere produced by decomposition of a gas containing N and Si, or a gas containing N and a gas containing Si, under the presence of heated catalytic substances.

In the invention, it is preferable that a well layer of the semiconductor laser manufactured by the above steps, is made of a composition of any elements selected from In, Al, Ga, P and As. These elements will form a chemically stable nitride film.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
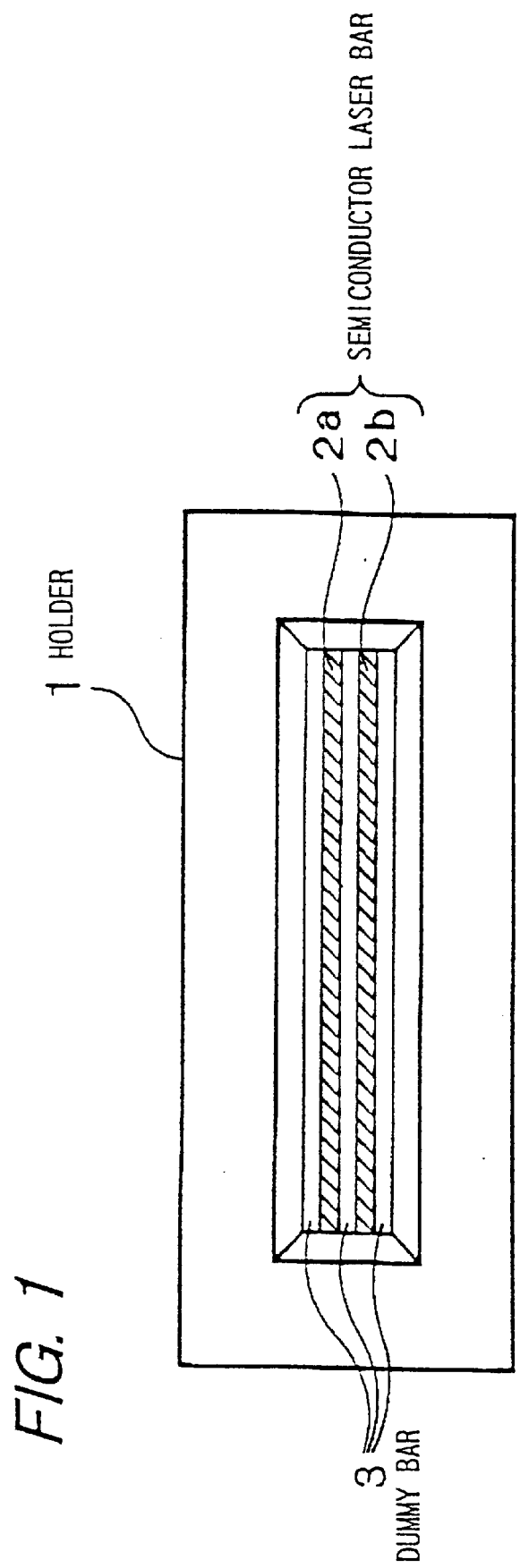
FIG. 1 is a diagram showing relationship between a holder and a cleavage plane according to an example.

The invention will be described in detail. A semiconductor laser comprises a semiconductor substrate, an active region formed thereon, at least a pair of cladding layers which sandwiches the active region, and p-side and n-side electrodes formed on the upper and lower surfaces, and the laser is formed on a wafer. Then, the wafer is cleaved into a bar shape in the air or nitrogen so as to have a desired resonator length, resulting in forming a semiconductor laser bar. The semiconductor laser bar is put into a vacuum apparatus using a holder so that the cleavage plane serving as a resonator plane is exposed to an atmosphere produced by decomposition of a gas containing N-atoms using a catalytic CVD apparatus. The catalytic CVD apparatus is used for the method of performing surface treatment or film formation, in which filament such as tungsten, which is a catalytic substance, is heated in a vacuum vessel and sprayed with a raw material gas, thereby generating a radical of the raw material gas by thermal contact decomposition with the use of catalytic action. The method is described in more detail in Hideki Matsumura, Jpn. J. Appl. Phys. 37, 3175 (1998), for example.

First, air is exhausted from the vacuum apparatus in which the holder to be stacked with a semiconductor laser chip is placed, by using a vacuum pump, to form a vacuum atmosphere at $1 \times 10^{-4}$ Pa or lower. Subsequently, $NH_3$ gas is introduced therein. In addition, the gas may be diluted with $H_2$ to control the etching speed of the natural oxide film. The flow rate or pressure of the gas introduced is varied depending on the pump performance or conditions of the apparatus. In particular, the achieved amount of the radical obtained by decomposition of a gas containing N atoms varies depending on the distance between the filament and the substrate and the pressure. Because of this, the substrate surface temperature and the processing time are also varied, so that optimization is necessary in respective apparatuses and in respective cases. For example, when the distance between the filament and the substrate is 60 mm, it is preferable that the pressure is approximately 0.75 Pa.

Subsequently, the filament is heated by DC power or the like. When tungsten is used as the filament, the filament surface temperature is required to be the temperature or higher, at which a gas containing N-atoms can be decomposed. For instance, $NH_3$ gas will be decomposed at 1000° C. While decomposed and generated radical species or decomposition efficiency is varied depending on the filament temperature, heat radiation from heated filament increases the substrate temperature. Since the amount of the temperature increase further depends on the pressure and the distance between the filament and the substrate as well as the filament temperature, the filament temperature should be optimized in consideration of the above matters. When the substrate temperature rises, the etching speed is increased. In the case of a radical produced by decomposition of $NH_3$ gas, the cleavage surface tends to be coarse. In general, in view of preventing an increase of the substrate temperature due to heat radiation, the temperature of 1400° C. or lower is desired as the filament temperature. Further, to prevent an increase of the substrate temperature, it is effective to cool surroundings of the substrate by means of water cooling.

After introducing gas, the filament temperature is increased-to be the temperature at which a gas containing N atoms can be decomposed. Then, the cleavage plane is exposed to a radical produced by decomposition of the gas containing N atoms, whereby etching of the cleavage plane can be performed. According to the method, heat contact decomposition using catalytic action is adopted instead of the decomposition utilizing high frequency electric field, so that damages which accompany ion generation or defects generated on the cleavage surface due to collision of accelerated ions, extremely become small. Further, nitrogenation of the surface occurs at the same time. The formation of GaN on a surface layer has an effect of terminating and decreasing the defects. In addition to this, since GaN has a wide band gap with respect to an active region composed of a composition of any elements selected from In, Al, Ga, P, and As, the formation of GaN is preferable in view of junction between a semiconductor and a dielectric film.

Furthermore, since GaN has excellent chemical stability, once GaN is formed, reoxidation will not occur even if the cleavage plane is exposed to the air. Therefore, it is possible to transport it in the air at the time of subsequently forming a dielectric film. Consequently, steps become simple. The process time varies depending upon adopted apparatus as mentioned above, however, it can be optimized by the check of roughness on the cleavage surface with AFM (intermolecular force microscope) or the binding state of oxygen and nitrogen, which are composition elements of the active region, with XPS. As an example, it is preferable to apply the method disclosed in A. Izumi et al./Thin Solid Films 343–344(1999)528–531.

Further, the portion except for the cleavage plane of the semiconductor laser bar, namely, upper and lower faces of the bar are coated with metal electrode while etching process. Etching rate of gold, gold alloy, platinum, or the like, which is commonly used for an electrode of the semiconductor laser, is extremely slow in comparison to that of a compound semiconductor. Because of this, when exposing the portion except for the cleavage plane to a radical produced by decomposition of a gas containing N-atoms, there is no damaged portion on the portion except for the cleavage plane within the range of time required for removing an oxide layer on the cleavage surface. Further, when semiconductor laser bars are laminated inside of the holder in order to expose the cleavage edge face of the semiconductor laser through the window portion of the holder, the portion except for the cleavage plane of the semiconductor laser bar is not exposed to the radical produced by decomposition of a gas containing N-atoms. Also, it is possible to prevent adhesion of the film to the portion except for the cleavage plane in a later film formation step.

By means of the catalytic CVD apparatus, the oxide layer formed on the cleavage surface is removed by etching using a radical produced by decomposition of a gas containing N-atoms and a nitride layer is formed, and thereafter a dielectric film is formed. Herein, the dielectric film is formed so as to control the reflectance of the cleavage plane, mainly.

Sputtering, CVD film formation, or the like can be used to form a dielectric film. As the dielectric film, an aluminum oxide film, an aluminum nitride film, a silicon film, a silicon oxide film, a silicon nitride film, a titanium oxide, or a lamination film thereof is preferable, and in particular, in order to suppress reoxidation caused by the dielectric film formation process on the cleavage surface, a non-oxide film is more suitable among the above mentioned films for the protection film which comes in contact with the cleavage plane.

Then, the cleavage plane is exposed to an atmosphere of a radical produced by decomposition of a gas containing N-atoms by using the catalytic CVD apparatus, whereby a surface layer such as a natural oxide film formed on the cleavage plane is removed and at the same time, a nitride layer is formed on the cleavage surface. Thereafter, an additional passivation film maybe formed before forming the dielectric film for controlling the reflectance to enhance the passivasion effect.

When considering the above matter, in comparison with the case where the dielectric film is formed by plasma process such as sputtering, the following process is preferable because it can prevent the plasma damage due to ion impact onto the cleavage plane at the time of forming a dielectric film. That is, after exposing to an atmosphere of a radical produced by decomposition of the gas containing N-atoms, a silicon nitride film is subsequently formed by using the same catalytic CVD apparatus. Further, since the silicon nitride film formed by the catalytic CVD apparatus, has a low film stress in the order of $10^9$ dyn/cm², it is preferable in the point that film peeling with time will rarely occur in comparison with the silicon nitride film formed by usual sputtering process. The silicon nitride film can be formed by supplying a gas containing N-atoms and $SiH_4$ gas in the catalytic CVD apparatus used for generating a radical produced by decomposition of the gas containing N-atoms to keep the filament temperature to be not lower than the temperature at which filament does not form silicide and not higher than the temperature at which vapor pressure of filament does not cause a problem. For instance, in the case of using tungsten as filament, the temperature at which film can be formed is within the range of from 1600° C. to 1900° C. As the flow rate of the gas containing N-atoms and the $SiH_4$ gas, optimum value which makes film stress the lowest value, may be used. Further, when thermal damage, which is caused on the cleavage edge face due to an increase of the filament temperature, becomes a problem, by reducing the film formation time, the silicon nitride film is formed to a thickness serving as a protection layer from plasma damage, for example, to a thickness of about 2 to 10 nm. Subsequently, a dielectric film having a desired reflectance may be formed by another process such as sputtering.

The semiconductor laser device according to the invention is not limited to its epitaxial structure or its composition, and can be widely applicable to any structure. To achieve higher power, the semiconductor laser device may have a structure as cladding layers in which a first cladding layer and a second cladding layer having a lower refractive index and a wider band gap than the first cladding layer, are provided viewed from the active region side, or completely separated confinement structure in which carrier blocking layers, waveguide layers, and cladding layers are provided on both sides of an active region, and which satisfies the relationship that carrier blocking layers have a lower refractive index than waveguide layers and cladding layers have a lower refractive index than active regions (See U.S. Pat. No. 005764668A for detail). Further, as the composition of an active region used for a device, GaAs, AlGaAs, InGaAs, or InGaAsP may be selected depending on the oscillation wavelength. Needless to say, another composition may be utilized and in particular, it is preferable to use composition having smaller band gap than GaN.

EXAMPLE

Figure 2:
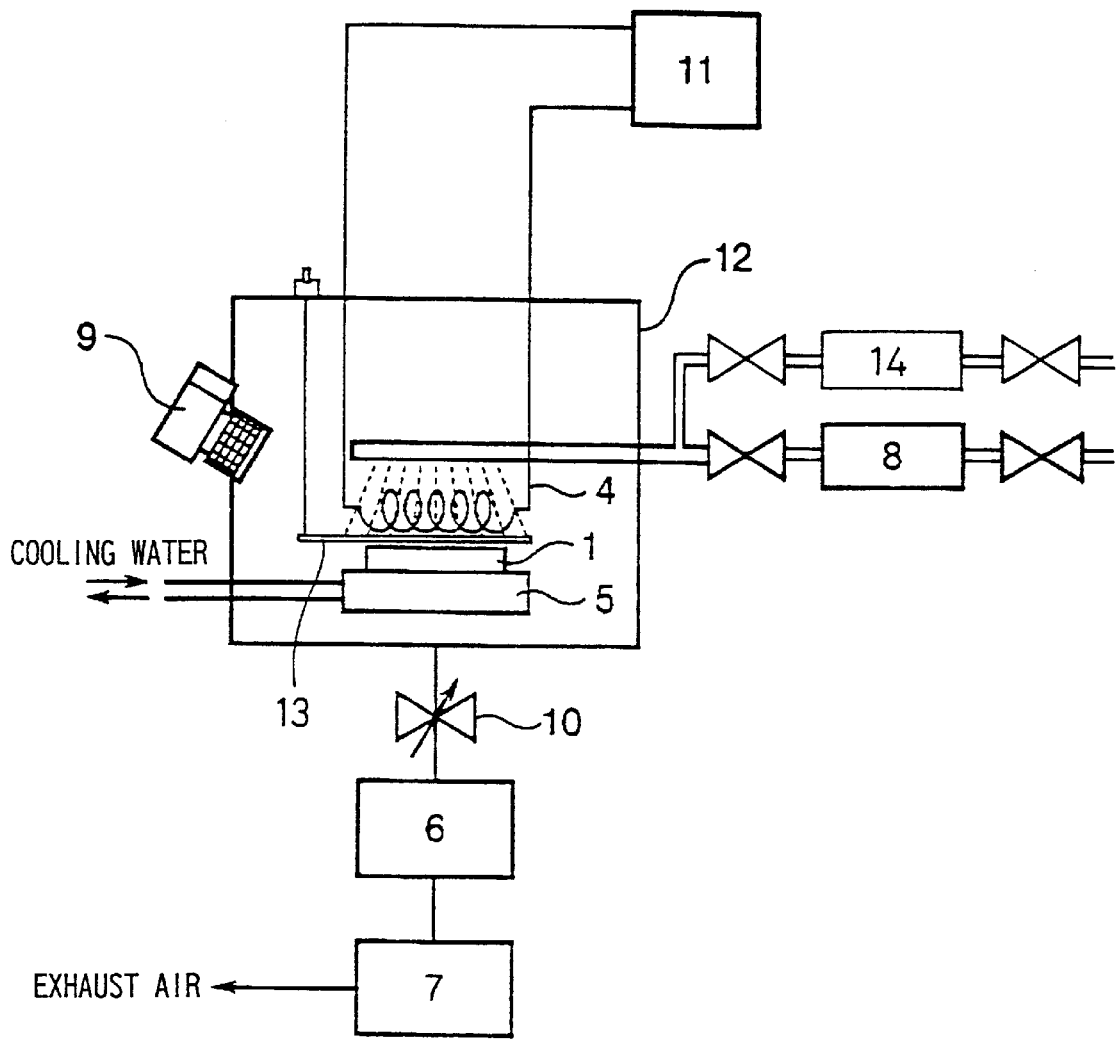
FIG. 2 is a schematic view showing a catalytic CVD apparatus and surroundings thereof utilized in the example.

The semiconductor laser has completely separated confinement structure in which a carrier blocking layer is interposed between an active region and a waveguide layer, and has a stripe width of 8 μm. Then, the semiconductor laser is designed to oscillates in a single mode in the wavelength of 860 nm range comprising a cladding layer made of AlGaAs, a waveguide layer made of AlGaAs, and an active region formed by hetero junction between AlGaAs and GaAs. A wafer to be formed with the semiconductor laser is cleaved into a bar-shape in the air so as to form a resonator length of 1.4 mm. Then, some of the semiconductor laser bars obtained by the cleaving, are placed in a holder. FIG. 1 shows the above state, more specifically, shows the plane which is exposed to a radical produced by decomposition of $NH_3$ gas by the catalytic CVD apparatus. In the holder 1, two semiconductor laser bars 2a and 2b and a dummy bar 3 are stacked on top of each other in layers so as to expose cleavage planes of the semiconductor laser bars 2a and 2b and the edge face of the dummy bar 3, which are formed on the same plane, to the window provided in the holder 1. Then, the holder 1 is put into the catalytic CVD apparatus. The catalytic CVD apparatus having the structure as shown in FIG. 2 is used herein. The holder 1 in which the semiconductor laser bars are stacked, is placed on a water-cooled board 5.

After the vacuum apparatus 12 is evacuated to ultimate vacuum of $3 \times 10^{-5}$ Pa by a rotary pump 7 and a turbo molecular pump 6, $NH_3$ gas of 50 sccm is introduced through a flow meter 8 and the pressure of the vacuum apparatus is maintained to be 0.75 Pa by a pressure control bulb 10. Then, the surface temperature of a tungsten filament 4, which is monitored with an infrared radiation thermometer 9, is heated to 1200° C. with a DC supply 11. By opening a shutter 13, the cleavage plane of the semiconductor laser bar, which is exposed to the window of the holder 1, is exposed to a radical produced by decomposition of $NH_3$ gas for three minutes. Then, after the treatment for three minutes, the shutter 13 is closed, heating of the filament is stopped, the flow rate of $NH_3$ gas is increased to be 60 sccm, and subsequently, $SiH_4$ gas of 1 sccm is introduced through a flow meter 14, and filament is again heated to 1800° C. In the state, the shutter 13 is opened and the cleavage plane of the semiconductor laser bar, which is exposed to the window of the holder 1, is exposed to radicals produced by decomposition of NH$_3$ gas and SiH$_4$ gas for two minutes, thereby the silicon nitride film is formed. At this time, the thickness of the film deposition is about 4 nm, which is based on the film deposition speed as conditions studied in advance. After forming the silicon nitride film, heating of the filament is stopped, introduction of SiH$_4$ gas and NH$_3$ gas is stopped, and then gas is exhausted with a vacuum pump. Subsequently, the holder to be stacked with the semiconductor laser bars is taken out from the vacuum vessel and is turned upside down. Then, the same treatment is performed on the opposite side of the cleavage plane. The holder to be stacked with semiconductor laser bars, in which both faces of the cleavage plane are treated, is moved to another vacuum apparatus, an anti-reflectivity (AR) coating with reflectance of 2% is applied on both faces of the cleavage plane by sputtering film deposition of an aluminum oxide. Further, high reflectivity (HR) coating with reflectance of 97% is applied on only one face of the cleavage plane by sputtering film deposition of a Si/SiO$_2$ multilayer film.

Figure 3:
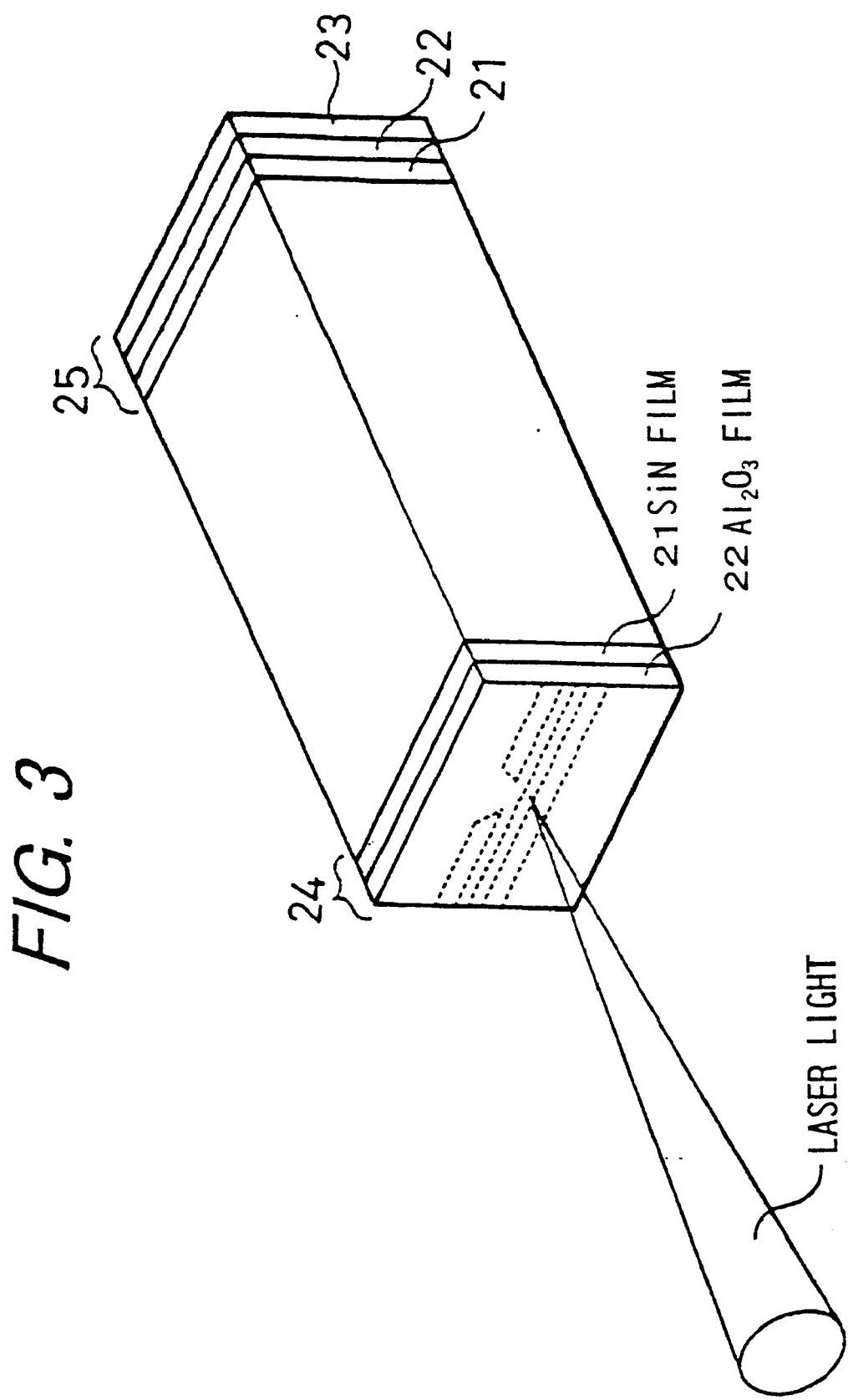
FIG. 3 is a schematic view showing a semiconductor laser chip obtained from the example.
Figure 4:
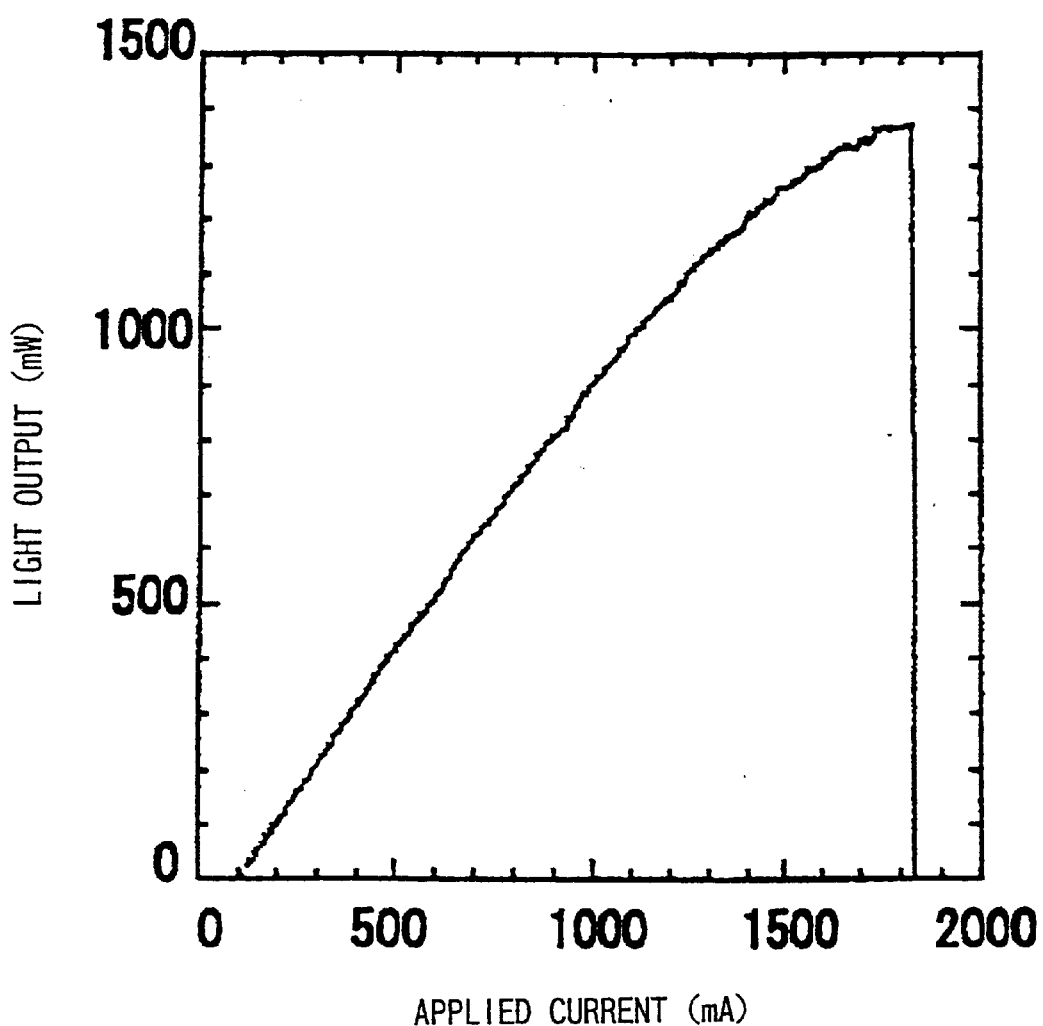
FIG. 4 is an output plot of a semiconductor laser obtained from the example.

These semiconductor laser bars are cut to form a chip-shape, obtaining a semiconductor laser chip as shown in FIG. 3. On a light outputting end surface which outputs a laser light, a silicon nitride film 21 and a lamination film 24 made of Al$_2$O$_3$ 22 are formed. On the opposite end face, the second lamination film 25 provided with a Si/SiO$_2$ multilayer film 23, is formed. After mounting the semiconductor laser chip on a mounting, to examine the intensity of the end face portion of light emission, maximum light output is examined by applying CW current at 25° C. As a result, catastrophic optical damage (COD) level shows high value of 1.4 W as shown in FIG. 4.

Figure 6:
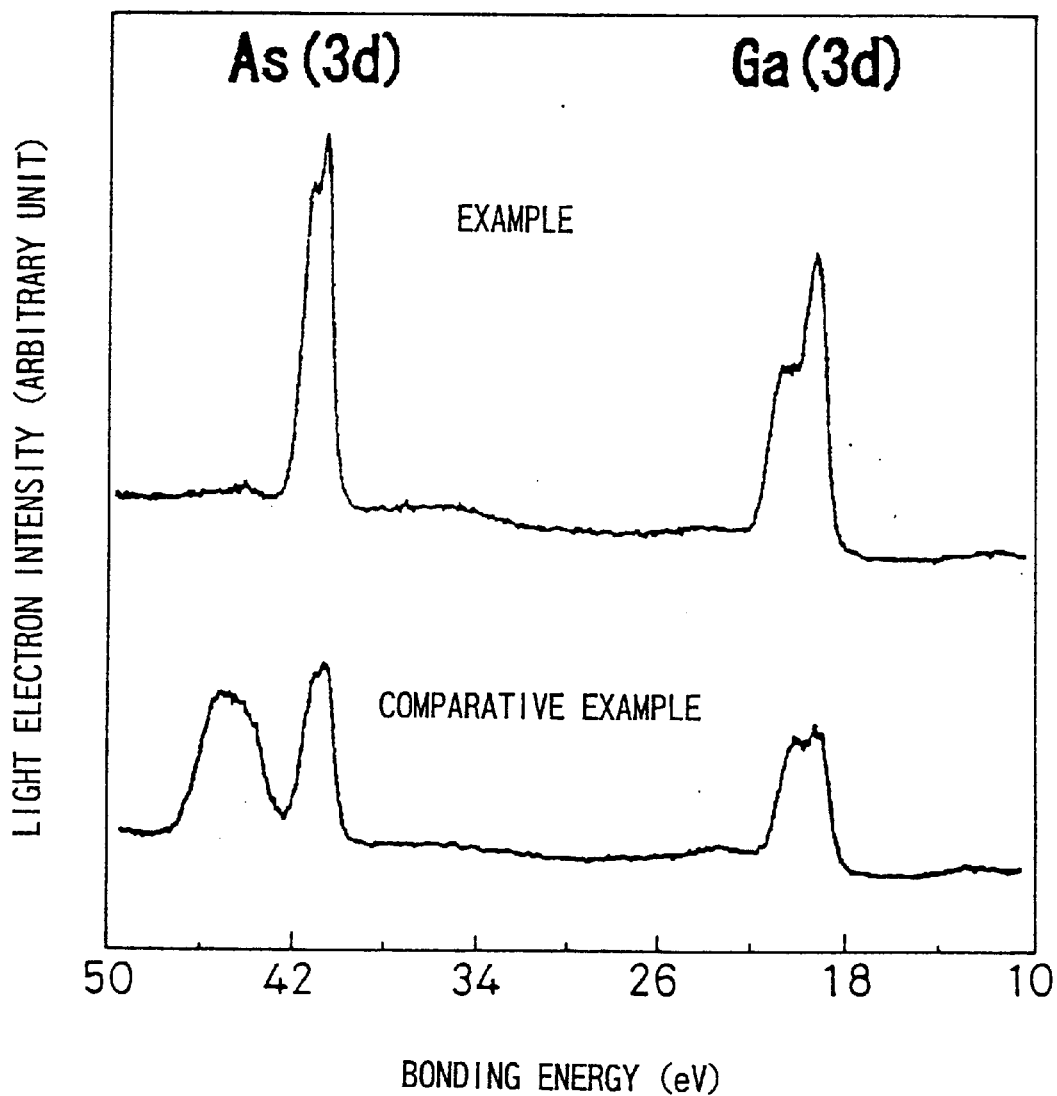
FIG. 6 shows X-ray photoelectron spectroscopy (XPS) plots regarding samples such as As3d and Ga3d obtained from the embodiment and the comparative example.
Figure 7:
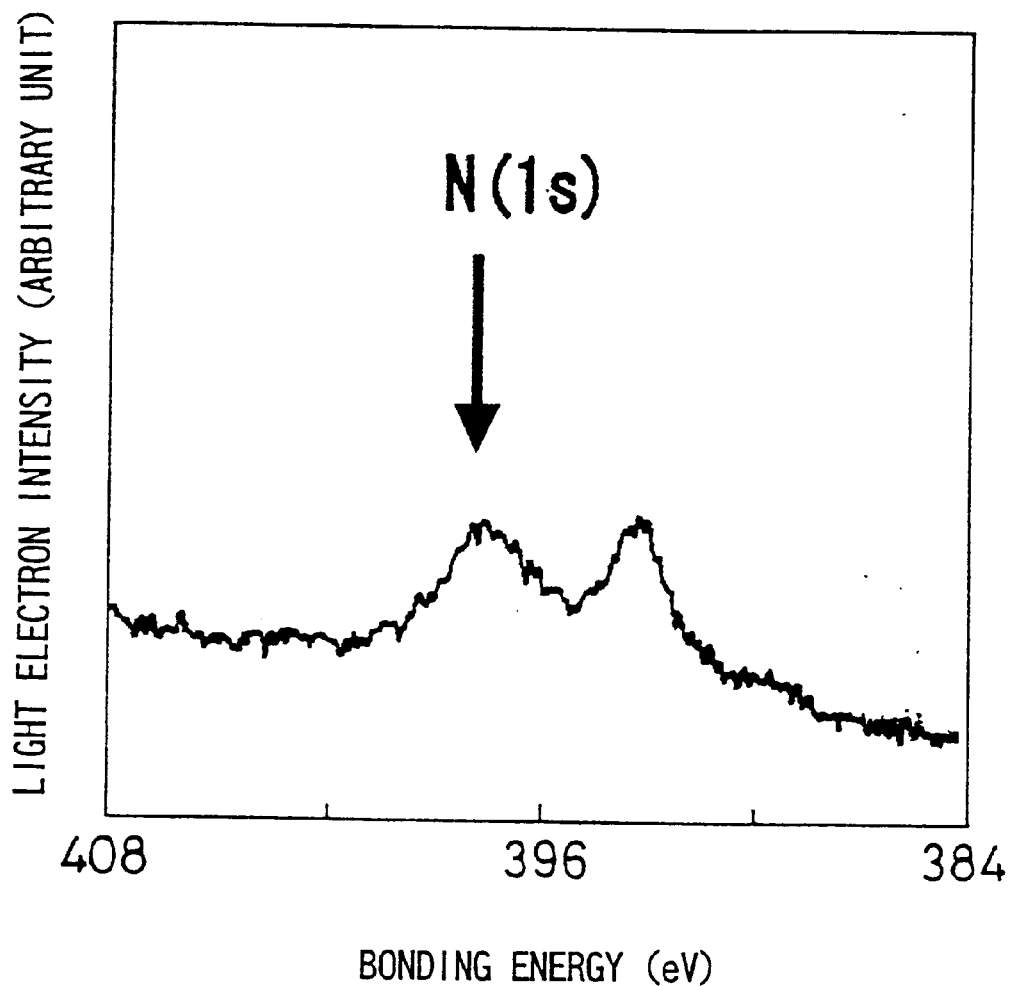
FIG. 7 shows an XPS plot regarding a sample such as N1s obtained from the example.
Figure 8:
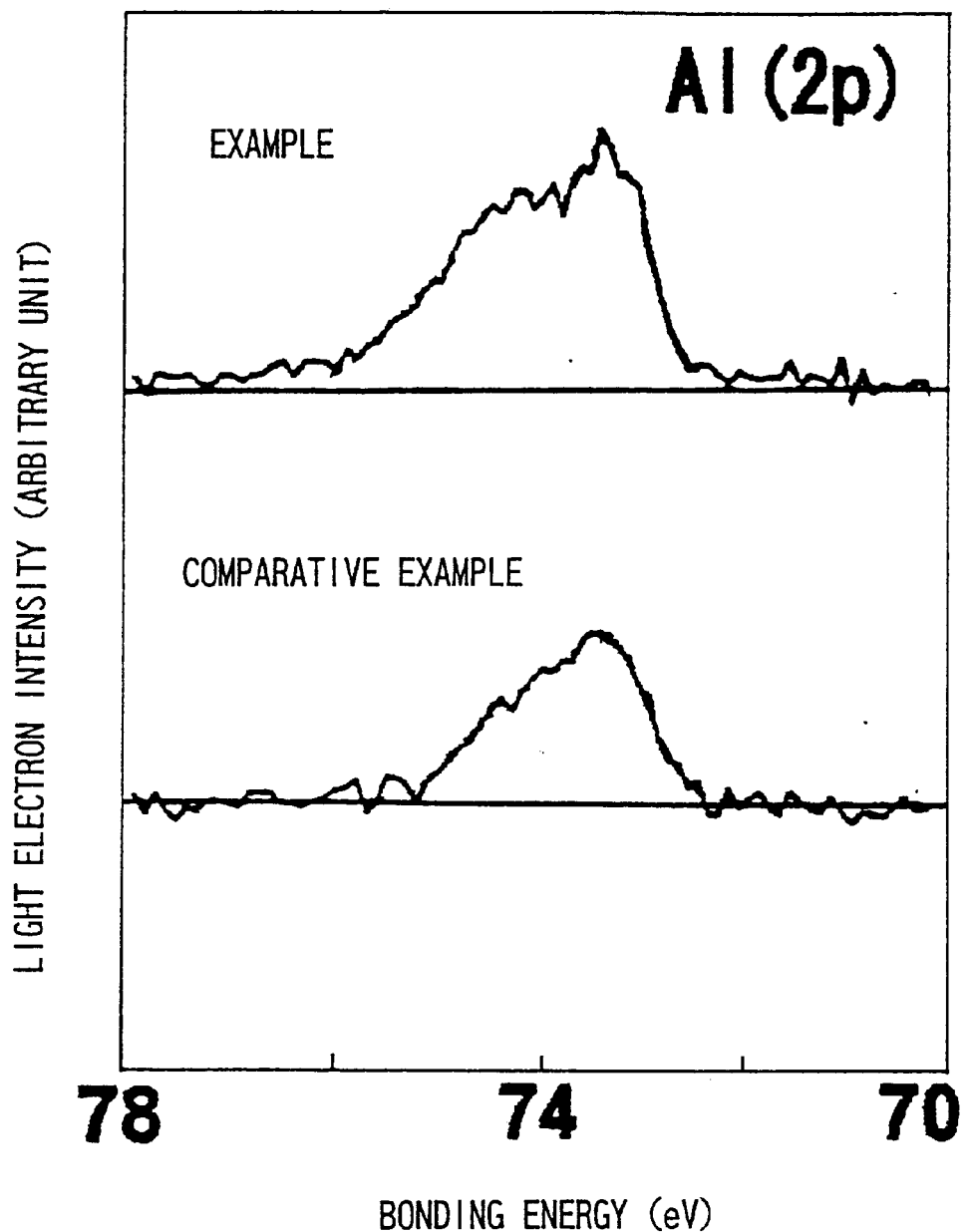
FIG. 8 shows XPS plots regarding a sample such as Al2p obtained from the example and the comparative example.

Further, the surface of the AlGaAs layer of the sample, in which epitaxial growths of an AlGaAs layer having 2 μm thickness is performed on a GaAs substrate, is treated by a radical produced by decomposition of NH$_3$ following the above mentioned procedure. Then, the surface is examined by XPS to check the binding state of surface elements. As a result, the binding caused by an oxide is not observed on As3d as shown in FIG. 6 and as shown in FIG. 7, N1s peak can be observed on the sample. Further, as shown in FIG. 8, high energy shift can be observed with respect to Al2p. According to these results, it is confirmed that elements for oxygen binding are decreased and a nitride layer containing AlGaN as a main component is formed on the surface of AlGaAs.

Comparative Example 1

Figure 5:
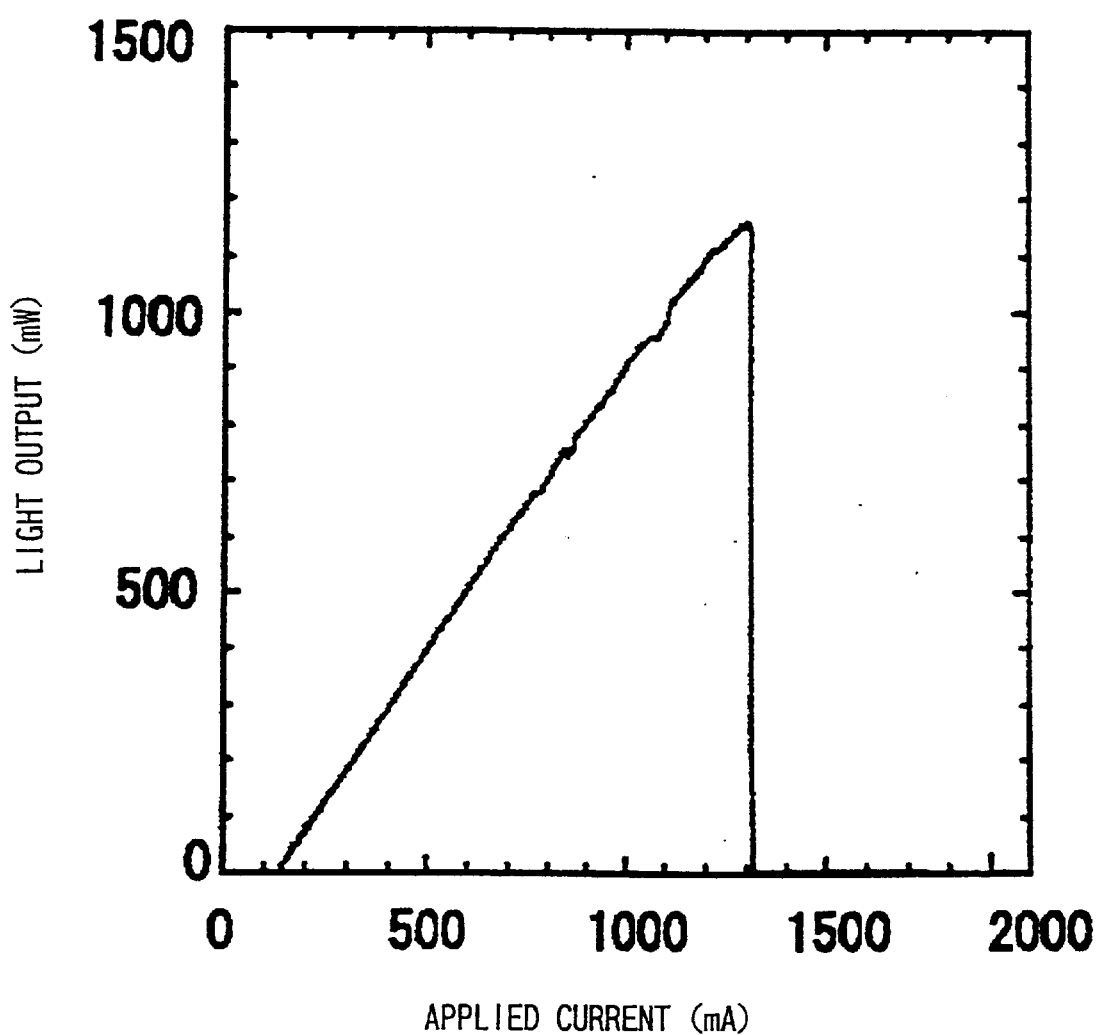
FIG. 5 is an output plot of a semiconductor laser obtained from the comparative example.

The semiconductor laser device, which is the same as that of the example, is cleaved into a bar-shape in the air and stacked in the holder. Then, the holder is put into the sputtering apparatus, and AR coating with reflectance of 2% is applied on both faces of the cleavage plane by forming aluminum nitride and subsequently an aluminum oxide by sputtering. Further, HR coating with reflectance of 97% is applied on only one face of the cleavage plane by forming a Si/SiO$_2$ multilayer film by sputtering. After thus formed semiconductor laser bars are cut into a chip-shape and mounted on a mounting, maximum light output is examined in the same manner as the example. As a result, catastrophic optical damage (COD) level shows about 1.2 W as shown in FIG. 5.

Moreover, in the same way as the example, to check binding state of surface elements regarding the sample in which an AlGaAs layer of 2 μm in thickness is formed on a GaAs substrate, the surface of the AlGaAs layer is examined by XPS. As a result, only the binding caused by an oxide is observed on Al, Ga, and As as shown in FIG. 6 and FIG. 8.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

EFFECT OF THE INVENTION

As described above, according to the invention, a high-power semiconductor laser device with high reliability can be achieved by treatment of the light emitting end face using relatively simple method. According to the method, a resonator plane of a semiconductor laser is formed by cleaving in the air and then put into a vacuum apparatus. Then, a natural oxide film formed on the cleavage plane is exposed to a radical gas containing N-atoms produced in the catalytic CVD apparatus, thereby removing by etching and forming a nitride layer at the same time. Subsequently, a dielectric film is formed on the surface.

What is claimed is:

1. A method of manufacturing a semiconductor laser comprising:

laminating a semiconductor thin film comprising an active layer on a semiconductor substrate;

cleaving the semiconductor substrate and the semiconductor thin film;

exposing a cleavage plane of the semiconductor substrate and semiconductor thin film obtained by cleaving to an atmosphere produced by decomposition of a gas containing N atoms, under the presence of heated catalytic substances, thereby removing the surface layer of the cleavage plane and forming a nitride layer on the surface; and subsequently forming a dielectric film on the cleavage plane.

2. The method of manufacturing a semiconductor laser of claim 1, wherein the dielectric film is formed by exposing the cleavage plane to an atmosphere produced by decomposition of a gas containing N and Si, or a gas containing N and a gas containing Si, under the presence of heated catalytic substances.

3. The method of manufacturing a semiconductor laser of claim 2, wherein the active layer is made of a composition of any elements selected from In, Al, Ga, P and As.

4. The method of manufacturing a semiconductor laser of claim 1, wherein the active layer is made of a composition of any elements selected from In, Al, Ga, P and As.

* * * * *